United States Patent
Sada et al.

(10) Patent No.: US 6,565,656 B2
(45) Date of Patent: May 20, 2003

(54) COATING PROCESSING APPARATUS

(75) Inventors: Tetsuya Sada, Kikuchi-gun (JP); Hiroshi Hashimoto, Kikuchi-gun (JP); Yuji Shimomura, Kikuchi-gun (JP)

(73) Assignee: Toyko Electron Limited, Tokyo (JP)

( * ) Notice: Subject to any disclaimer, the term of this patent is extended or adjusted under 35 U.S.C. 154(b) by 109 days.

(21) Appl. No.: 09/738,814

(22) Filed: Dec. 15, 2000

(65) Prior Publication Data

US 2001/0003965 A1 Jun. 21, 2001

(30) Foreign Application Priority Data

Dec. 20, 1999 (JP) .......................................... 11-360151

(51) Int. Cl.⁷ ............................................... B05C 11/06
(52) U.S. Cl. .............................. 118/50; 118/52; 118/56; 118/62; 118/63; 118/64
(58) Field of Search .............................. 118/52, 56, 320, 118/50, 500, 58, 62, 63, 64; 427/240, 428

(56) References Cited

U.S. PATENT DOCUMENTS

| | | | |
|---|---|---|---|
| 5,415,691 A | * | 5/1995 | Fujiyama et al. .............. 118/52 |
| 5,718,763 A | | 2/1998 | Tateyama et al. |
| 5,762,708 A | | 6/1998 | Motoda et al. |
| 5,906,860 A | | 5/1999 | Motoda et al. |

* cited by examiner

Primary Examiner—Richard Crispino
Assistant Examiner—George R Koch, III
(74) Attorney, Agent, or Firm—Oblon, Spivak, McClelland, Maier & Neustadt, P.C.

(57) ABSTRACT

A coating processing apparatus is structured by a rotating cup having an opening portion on the top thereof for housing a substrate, a spin chuck for rotating the substrate in the rotating cup, a lid body having an opening and attached to the rotating cup, a resist solution discharge nozzle for discharging a resist solution onto the substrate through the opening of the lid body, a small lid for blocking up the opening of the lid body, and a protrusion member provided on the underneath surface of the small lid to be positioned inside the rotating cup when the small lid is attached into the opening of the lid body. Thus, adjustment of a film thickness of a coating film after a coating solution is coated can be effectively performed.

14 Claims, 11 Drawing Sheets

COATING PROCESSING APPARATUS

CROSS-REFERENCE TO RELATED APPLICATIONS

This application is based upon and claims the benefit of priority from the prior Japanese Patent Application No. 11-360151, filed Dec. 20, 1999, the entire contents of which are incorporated herein by reference.

BACKGROUND OF THE INVENTION

This invention relates to a coating processing apparatus for coating a coating solution such as a resist solution on the surface of a liquid crystal display device (LCD) substrate and a semiconductor substrate.

In manufacturing a liquid crystal display (LCD), a circuit pattern is formed by a so-called photolithography in which a rectangular LCD substrate made of glass is coated with a photo resist solution to form a resist film, the resist film is exposed in accordance with the circuit pattern, which is subjected to a developing processing. A resist coating and developing system including a plurality of processing units for performing a series of processings like these has been hitherto used.

In the resist coating and developing system like this, the rectangular LCD substrate is subjected to a hydrophobic processing (HMDS processing) in an adhesion processing unit in order to increase an adhering property of the resist, cooled in a cooling unit, and then carried into a resist coating unit in the process of coating a resist solution. In the resist coating unit, the substrate is rotated while being held on a spin chuck, the resist solution is supplied from a nozzle provided thereon to the surface of the substrate, the resist solution is diffused by centrifugal force by the rotation of the substrate, and thus the resist film is formed on the entire face of the substrate.

The substrate coated with the resist solution is rid of the excess resist in the peripheral edge in an edge surface processing unit (edge remover), carried into a heating unit to be subjected to a prebaking processing, cooled in the cooling unit, carried into an aligner where an exposure is performed in accordance with a predetermined pattern, and subjected to the developing and a postbaking processing to form a predetermined resist pattern.

Regarding to the aforesaid resist coating, a method of dropping the resist solution at the almost center of the substrate provided inside a cup, and then rotating the substrate at high speed to diffuse and coat the resist solution by centrifugal force has conventionally been known.

The resist film with uniform film thickness over the entire face of the substrate can be obtained to a certain extent by the aforesaid method, however, there is a possibility that an ununiformity of the local film thickness such as the thicker film thickness in the center part of the substrate may occur by the influence of the temperature, humidity and so on. When the ununiformity like this occurs, the film thickness is adjusted by controlling the temperature and the humidity inside the cup, but the film thickness is not necessarily adjusted enough, and therefore a means for effectively adjusting the film thickness after the resist solution is coated is required.

BRIEF SUMMARY OF THE INVENTION

An object of the present invention is to provide a coating processing apparatus which can effectively perform the adjustment of a film thickness of a coating film after a coating solution is coated.

To solve the aforesaid problem, according to a first aspect of the present invention, a coating processing apparatus for coating a coating solution onto the surface of a substrate, comprising: a processing container having an opening portion on the top thereof for housing the substrate, a substrate rotating member for rotating the substrate in the processing container, a coating solution discharge nozzle for discharging the coating solution onto the substrate, and an airflow forming portion for forming an airflow which can adjust a film thickness of the substrate in the processing container.

According to a second aspect of the present invention, a coating processing apparatus for coating a coating solution onto the surface of a substrate, comprising: a processing container having an opening portion on the top thereof for housing the substrate, a lid body attached to the processing container, a substrate rotating member for rotating the substrate in the processing container, a coating solution discharge nozzle for discharging the coating solution onto the substrate, and an airflow forming portion for forming an airflow which can adjust a film thickness of a coating film in the processing container.

According to the first aspect and the second aspect, the airflow forming portion for forming the airflow which can adjust the film thickness of the substrate is provided in the processing container so that the variation of the coating film thickness by the change of the temperature of the coating solution or the like can be decreased and the film thickness of the coating film can be adjusted. That is, according to the experimental result by the present inventors, the film thickness of the coating film changes by forming the airflow in the processing container so that it is found out that the film thickness can be adjusted by forming a desired airflow corresponding to a profile of the film thickness to be formed and thus a uniform film thickness can be obtained, which resulted in the accomplishment of the present invention.

For example, when the lid body is provided to be attached to the processing container and the film thickness of the coating film is adjusted with the lid body attached, it is easier to obtain the uniform film thickness compared with the case without the lid body, nevertheless the film thickness in the center of the substrate, for example, becomes thicker. In this case, a protrusion member as the airflow forming portion is formed at a predetermined position in the underneath surface of the lid body so that the airflow can be formed by the protrusion member at the predetermined position in the processing container when the lid body is rotated with the substrate and the processing container, which makes it possible to adjust the film thickness. For example, the protrusion member is formed in the center of the underneath surface of the lid body so that the airflow can be formed in the center part of the processing container and the film thickness in the center part can be adjusted. Thus, the coating film with the uniform film thickness can be obtained.

Further, in either case where the lid body is attached/not attached to the processing container, the airflow can be formed at the predetermined position in the processing container by providing a ventilating means as the air flow forming portion at the predetermined position directly above the substrate inside the processing container to form the airflow, which makes it possible to adjust the film thickness to obtain the coating film with uniform film thickness.

According to a third aspect of the present invention, a coating processing apparatus for coating a coating solution onto the surface of a substrate, comprising: a processing container having an opening portion on the top thereof for housing the substrate, a substrate rotating member for rotating the substrate in the processing container, a lid body having an opening and attached to the processing container, a coating solution discharge nozzle for discharging the coating solution onto the substrate through the opening of the lid body, a small lid for blocking up the opening of the lid body, a small lid carrier means for carrying the small lid to attach the small lid into the opening of the lid body, and a protrusion member provided on the underneath surface of the small lid to be positioned inside the processing container when the small lid is attached into the opening of the lid body.

The aforesaid third aspect of the present invention includes the lid body having the opening and the small lid for blocking up the opening so that the coating solution is discharged from the coating solution discharge nozzle through the opening of the annular lid body, and the small lid is attached into the opening of the annular lid body after the coating solution is discharged to thereby adjust the film thickness. Therefore, when the solution is discharged, the scatter of the coating solution to the outside can be prevented with the annular lid body even when the substrate is rotated while the coating solution is discharged, which is so-called a dynamic coating method, and after the coating solution is discharged, the scatter of the coating solution to the outside can be prevented with the annular lid body and the small lid, and thus the scatter of the coating solution can be securely prevented from the start of the coating to the end.

However, in the apparatus like this, the coating solution discharge nozzle is normally inserted from the opening in the center of the lid body and the resist solution as the coating solution is discharged from the coating solution discharge nozzle to form the resist film on the substrate, in the meantime, the drying in the area which corresponds to the opening of the coating film progresses faster and a peculiar region of the airflow is likely to be formed in the area which is right under the opening of the processing container, that is in the center part. Therefore, when the film thickness is adjusted by rotating the substrate with the small lid attached, there arises a problem that the film thickness of the resist film in the center part of the substrate becomes thicker.

Meanwhile, as described above, the protrusion member is provided on the underneath surface of the small lid to position the protrusion member inside the processing container when the small lid is attached into the opening of the lid body so that the film thickness of the coating film such as the resist film can be adjusted by forming the airflow inside the processing container when the processing container, the lid body and the small lid are rotated with the substrate, and the coating film with uniform film thickness can be obtained.

These objects and still other objects and advantages of the present invention will become apparent upon reading the following specification when taken in conjunction with the accompanying drawings.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Hereinafter, preferred embodiments of the present invention will be described with reference to the accompanying drawings.

Figure 1:
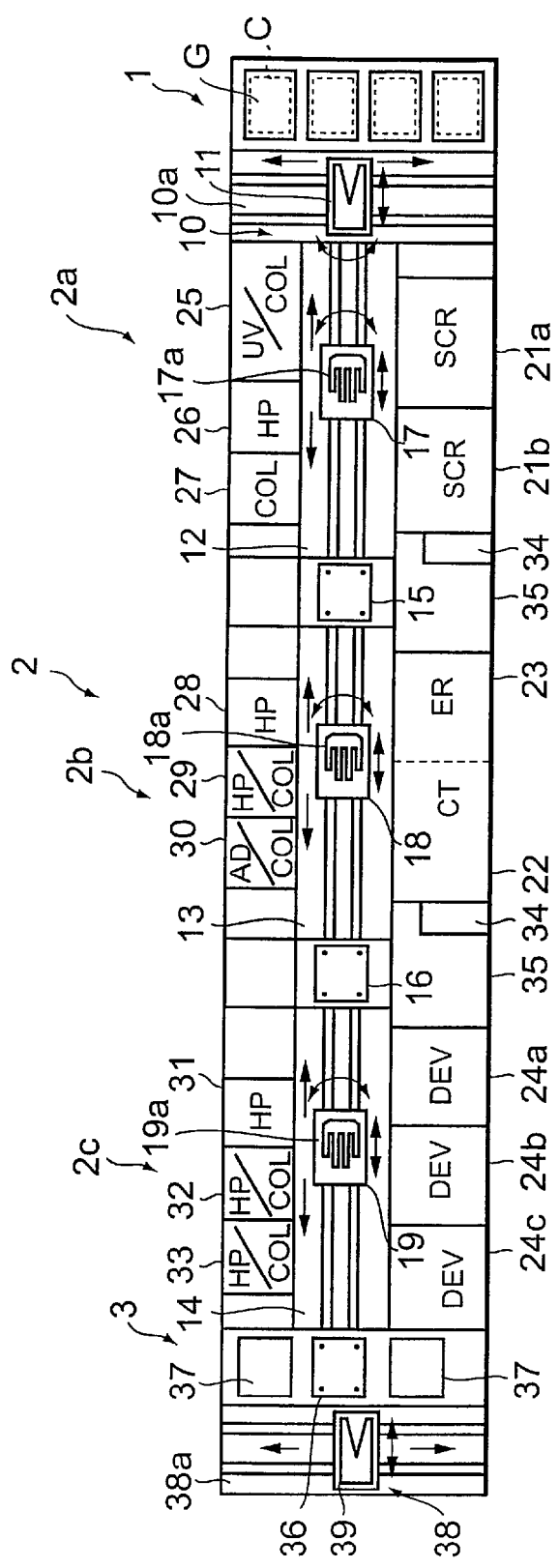
FIG. 1 is a plane view showing a resist coating and developing system to which a coating processing apparatus of the present invention is applied.

FIG. 1 is a plane view showing a resist coating and developing system of an LCD substrate to which the present invention is applied.

The coating and developing processing system includes a cassette station 1 on which a cassette C housing a plurality of substrates G is mounted, a processing section 2 which includes a plurality of processing units for performing a series of processings including a resist coating and a developing on the substrate G, and an interface section 3 which receives and sends the substrate G from/to an aligner (not shown), and the cassette station 1 and the interface section 3 are disposed respectively on each end of the processing section 2.

The cassette station 1 includes a carrier mechanism 10 which carries the LCD substrate G between the cassette C and the processing section 2. Carrying-in/out of the cassette C is performed in the cassette station 1. Further, the carrier mechanism 10 includes a carrier arm 11 which is movable on a carrier path 10a provided along the alignment direction of the cassette, and the substrate G is carried between the cassette C and the processing section 2 by the carrier arm 11.

The processing section 2 is divided into a front section 2a, a middle section 2b, and a rear section 2c, each of which has a carrier path 12, 13, 14 in its center and each of the processing units is arranged at both sides of the carrier paths. Relay sections 15, 16 are provided between them.

The front section 2a includes a main carrier device 17 which is movable along the carrier path 12, and two scrubbing units (SCR) 21a, 21b are disposed at one side of the carrier path 12, and a processing block 25 in which an ultraviolet-light irradiating unit (UV) and a cooling unit (COL) are two-tiered, a processing block 26 in which heating units (HP) are two-tiered, and a processing block 27 in which cooling units (COL) are two-tiered are disposed at the other side of the carrier path 12.

Further, the middle section 2b includes a main carrier device 18 which is movable along the carrier path 13, and a resist coating unit (CT) 22 and a peripheral edge resist removing unit (ER) 23 which removes a resist in a peripheral edge part of the substrate G are integrally provided at one side of the carrier path 13, and a processing block 28 in which heating units (HP) are two-tiered, a processing block 29 in which a heating unit (HP) and a cooling unit (COL) are vertically tiered, and a processing block 30 in which an adhesion processing unit (AD) and a cooling unit (COL) are vertically tiered are disposed at the other side of the carrier path 13.

Furthermore, the rear section 2c includes a main carrier device 19 which is movable along the carrier path 14, and three developing units (DEV) 24a, 24b, 24c are disposed at one side of the carrier path 14, and a processing block 31 in which heating units (HP) are two-tiered, processing blocks 32, 33 in both of which a heating unit (HP) and a cooling unit (COL) are vertically tiered are disposed at the other side of the carrier path 14.

Incidentally, the processing section 2 is structured to dispose the spinner units group such as the scrubbing unit 21a, the resist coating unit 22 and the developing unit 24a only at one side across the carrier path, and to dispose the heating units group such as the heating unit and the cooling unit only at the other side thereof.

Moreover, at the portion of the spinner units group disposing side of the relay sections 15, 16, a chemicals feed unit 34 is disposed and further a space 35 for performing the maintenance of the main carrier devices is provided.

Each of the aforesaid main carrier devices 17, 18, 19 includes an X-axis drive mechanism and a Y-axis drive mechanism which are in the two directions in a horizontal surface and a Z-axis drive mechanism which is in the vertical direction, further includes a rotation drive mechanism which rotates around the Z-axis, and has arms 17a, 18a, 19a each of which respectively supports the substrate G.

The main carrier device 17 performs the delivery of the substrate G from/to the arm 11 of the carrier mechanism 10, while having the functions of carrying the substrate G in/out of each processing unit of the front section 2a and performing the delivery of the substrate G from/to the relay section 15. Further, the main carrier device 18 performs the delivery of the substrate G from/to the relay section 15, while having the functions of carrying the substrate G in/out of each processing unit of the middle section 2b and performing the delivery of the substrate G from/to the relay section 16. Furthermore, the main carrier device 19 performs the delivery of the substrate G from/to the relay section 16, while having the functions of carrying the substrate G in/out of each processing unit of the rear section 2c and performing the delivery of the substrate G from/to the interface section 3. Incidentally, the relay sections 15, 16 also function as cooling plates.

The interface section 3 includes an extension 36 which temporarily holds the substrate when the substrate is delivered from/to the processing section 2, two buffer stages 37 which are provided on both sides thereof to dispose a buffer cassette, and a carrier mechanism 38 which carries the substrate G between these and the aligner (not shown). The carrier mechanism 38 includes a carrier arm 39 which is movable on a carrier path 38a provided along the alignment directions of the extension 36 and the buffer stages 37, and the substrate G is carried between the processing section 2 and the aligner by the carrier arm 39.

Thus, respective processing units are concentrated and integrated to thereby reduce the space and increase the efficiency of the processing.

In thus-structured resist coating and developing system, the substrate G in the cassette C is carried to the processing section 2, which is first subjected to a surface modification and a scrubbing processing in the ultraviolet-light irradiating unit (UV) of the processing block 25 of the front section 2a in the processing section 2, cooled in the cooling unit (COL), performed with a scrubber cleaning in the scrubbing units (SCR) 21a, 21b, dried by heating in either heating units (HP) in the processing block 26, and cooled in either cooling units (COL) in the processing block 27.

Subsequently, the substrate G is carried to the middle section 2b, which is subjected to a hydrophobic processing (HMDS processing) in the adhesion processing unit (AD) in the upper tier of the processing block 30 in order to increase an adhering property of the resist, cooled in the cooling unit (COL) in the lower tier, and coated with the resist in the resist coating unit (CT) 22, and the excess resist in the peripheral edge of the substrate G is removed in the peripheral edge resist removing unit (ER) 23. Then, the substrate G is subjected to a prebaking processing in one of the heating units (HP) in the middle section 2b and cooled in the cooling unit (COL) in the lower tier of the processing block 29 or 30.

Thereafter, the substrate G is carried by the main carrier device 19 from the relay section 16 through the interface section 3 to the aligner, where an exposure is performed in accordance with a predetermined pattern. Then, the substrate G is carried in again through the interface section 3, which is subjected to a post-exposure baking processing as necessary in any of the heating units (HP) of the processing blocks 31, 32, 33 of the rear section 2c and then a developing processing is performed in any of the developing units (DEV) 24a, 24b, 24c to form a predetermined circuit pattern. The developing processed substrate G is subjected to a postbaking processing in any of the heating units (HP) of the rear section 2c, cooled in either cooling unit (COL), and housed in a predetermined cassette on the cassette station 1 by the main carrier devices 19, 18, 17 and the carrier mechanism 10.

Figure 2:
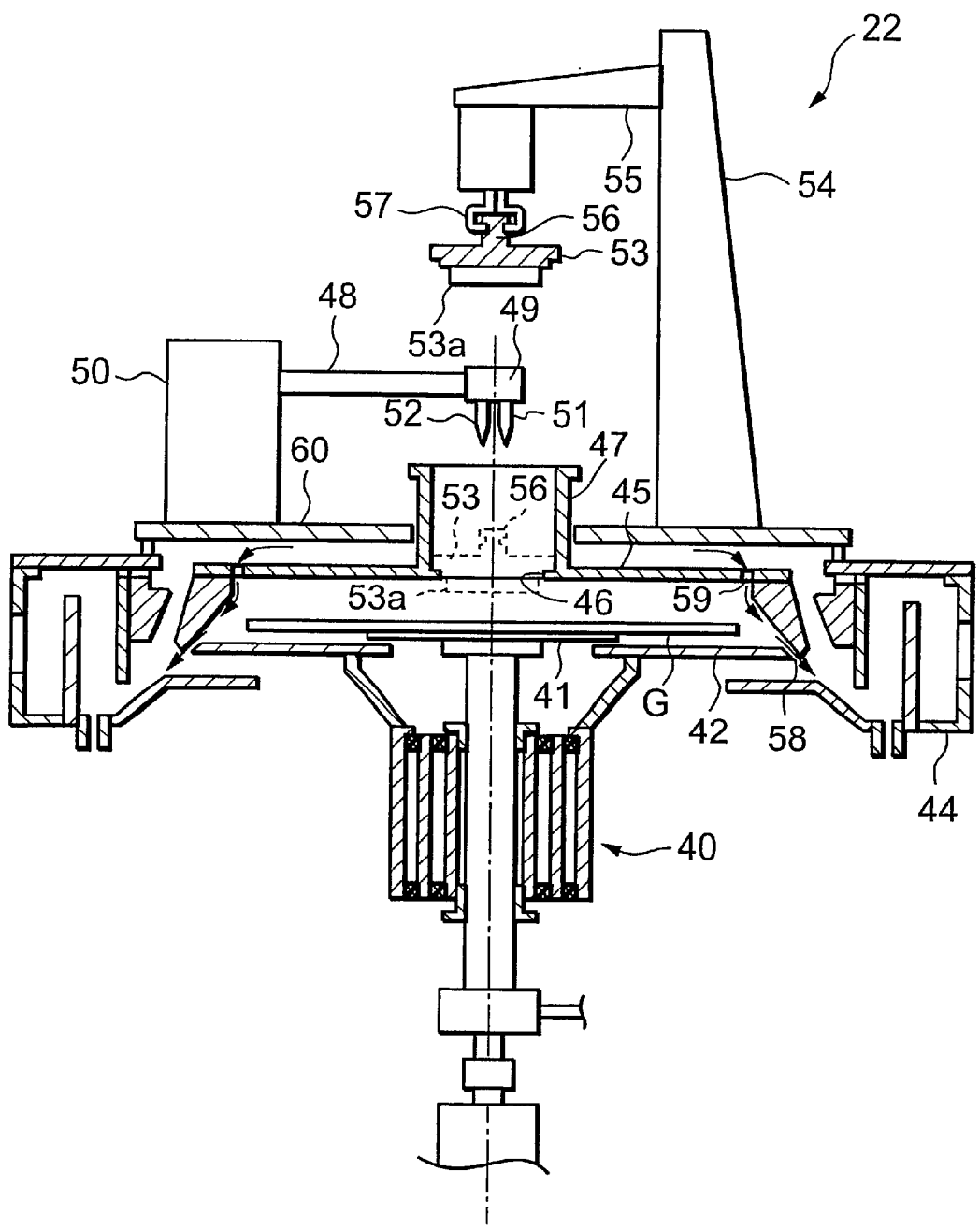
FIG. 2 is a sectional view showing a situation before a small lid is attached to a resist coating unit according to an embodiment of the present invention, which is mounted on the aforesaid resist coating and developing system.
Figure 3:
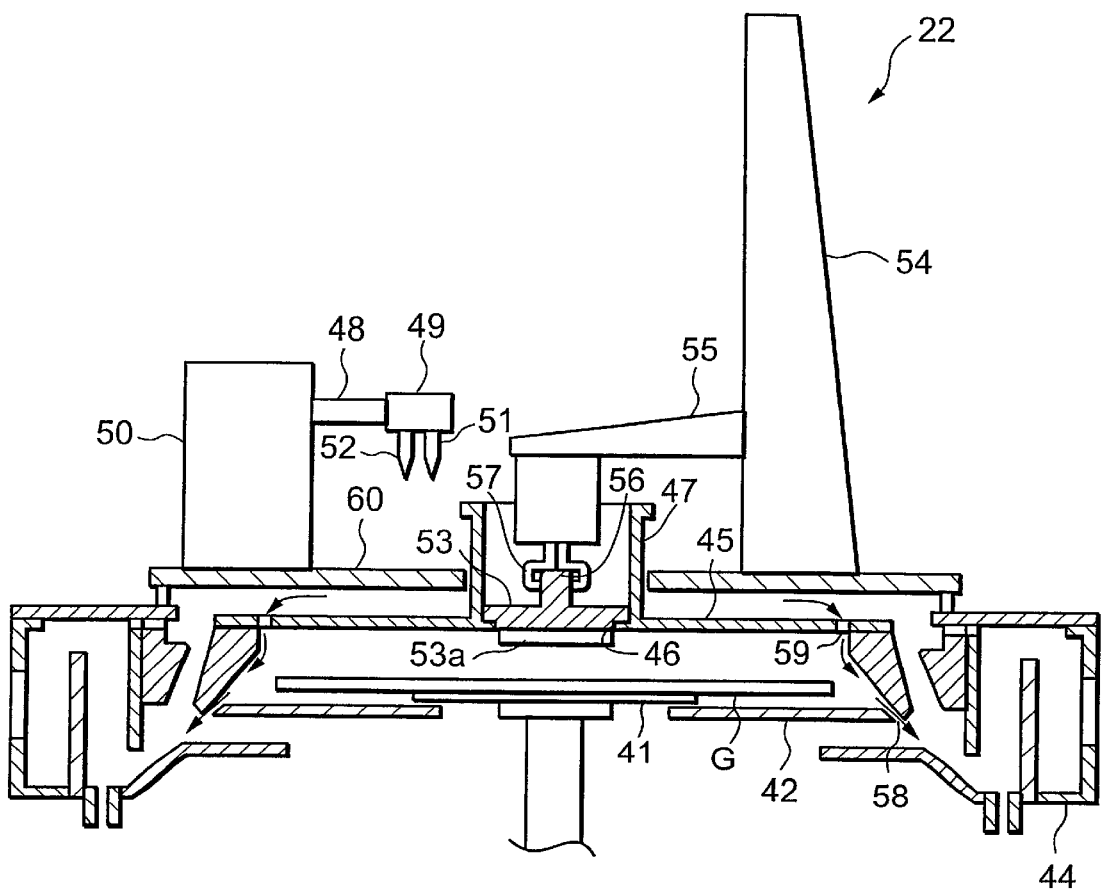
FIG. 3 is a sectional view showing a situation after the small lid is attached to the resist coating unit according to the embodiment of the present invention, which is mounted on the aforesaid resist coating and developing system.

Next, the resist coating unit (CT) 22 according to an embodiment of the present invention will be explained. FIGS. 2 and 3 are sectional views schematically showing the resist coating unit according to the embodiment of the present invention, FIG. 2 is the view showing a situation before a small lid is attached, and FIG. 3 is the view showing a situation with the small lid attached.

As shown in FIG. 2, a spin chuck 41 which is rotated by, for example, a drive device 40 is rotatively provided in the resist coating unit (CT) 22, and the LCD substrate G is sucked and mounted on the spin chuck 41 while keeping its surface horizontally. Further, a container for receiving the substrate, for example, a closed end cylinder-shaped rotating cup (processing container) 42 is provided, which is rotated with the spin chuck 41 and surrounds the spin chuck 41 and the substrate G from the bottom.

On the outer peripheral side of the rotating cup 42, a drain cup 44 in a shape of a hollow ring, which covers the outer peripheral side and the bottom side of the rotating cup 42 is disposed. The drain cup 44 is able to lead a resist solution which is scattered during the resist coating to the bottom thereof.

A not-shown attaching arm allows an annular lid body 45 which has an opening 46 in its center to be attached into the upper opening of the rotating cup 42. The annular lid body 45 is made to rotate with the rotating cup 42 when the rotating cup 42 is rotated with the substrate G. A cylinder-shaped cylindrical member 47 is provided standingly in order to prevent the scatter of the resist solution when the resist solution is discharged.

A not-shown attaching arm allows an outer lid 60 to be attached over the rotating cup 42, and a supporting post 50 and a supporting post 54 are provided standingly on the outer lid.

An arm 48 having a jet head 49 for supplying the resist solution and a solvent to the substrate G at the tip thereof is extended from the supporting post 50. A nozzle unit of multiple system which consists of a coating solution discharge nozzle, for example, a resist solution discharge nozzle 51 for discharging the resist solution and a solvent discharge nozzle 52 for discharging the solvent such as thinner is provided on the jet head 49.

Further, the arm 48 is so structured that it can be freely rocked and freely raised and lowered by a mechanism (not shown) inside the supporting post 50, which allows the resist solution discharge nozzle 51 and the solvent discharge nozzle 52 to be positioned above the substrate G and above the opening 46 of the annular lid body 45 when the resist solution and the solvent are discharged, and to be moved to the sheltering position as shown in FIG. 3 after the resist solution or the like is discharged.

The opening 46 of the annular lid body 45 is structured so that a small lid 53 is attached thereinto. The small lid 53 is carried by a carrier arm 55 which is provided extendingly from the supporting post 54. The carrier arm 55 is structured to be ascendable and descendable by a mechanism (not shown) inside the supporting post 54 and has a hooking claw 57 at the tip thereof for hooking a hooking portion 56 of the small lid 53. Further, the carrier arm 55 hangs the small lid 53 and attaches the small lid 53 into the opening 46 as shown in FIG. 3. The small lid 53 is sealed by a suitable sealing mechanism (not shown).

A protrusion member 53a is provided on the underneath surface of the small lid 53. The underneath surface of the small lid 53 is level with the underneath surface of the lid body 45, and the protrusion member 53a is made to position itself inside the rotating cup 42 when the small lid 53 is attached into the opening 46 of the lid body 45. Further, when the resist solution is diffused, the small lid 53 is rotated with the substrate G, the rotating cup 42 and the lid body 45, to thereby form an airflow inside the rotating cup 42 by the protrusion member 53a. That is, the protrusion member 53a functions as an airflow forming portion. By changing the shape of the protrusion member 53a, the airflow can be adjusted.

Moreover, a plurality of air outflow holes 58 are provided on the circumference of the outer peripheral portion of the bottom part of the rotating cup 42, and a plurality of air inflow holes 59 are provided on the circumference of the outer peripheral portion of the annular lid body 45. The rotating cup 42 is rotated to centrifuge the air inside the rotating cup 42 so that the air is flowed out through the outflow holes 58 of the rotating cup 42, as well as the airflow in which the air is flowed in from the outside through the inflow holes 59 of the lid body 45 is formed as shown in the arrows in FIGS. 2 and 3. Namely, the inflow holes 59 and the outflow holes 58 also function as the airflow forming portions. Further, by changing the sizes of the outflow holes 58 and the inflow holes 59, the airflow can be adjusted.

Figure 4A:
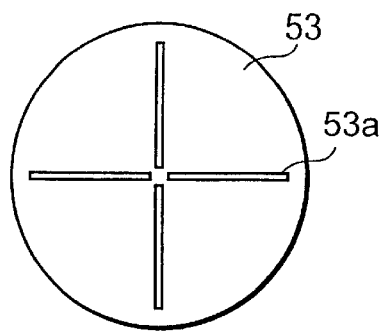
FIGS. 4A to 4D are bottom views showing examples of shapes of protrusion members attached to the underneath surface of the small lid.
Figure 4B:
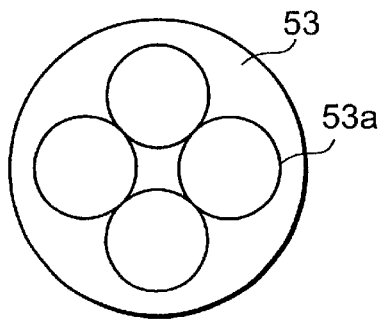
Figure 4C:
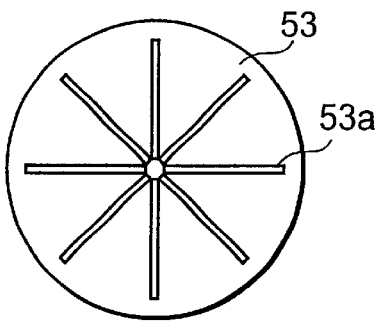
Figure 4D:
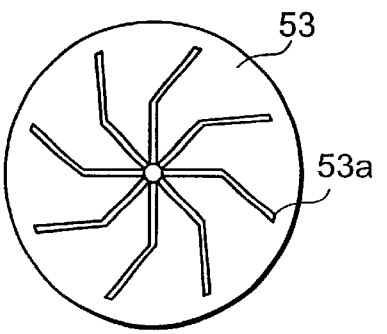

The shape of the aforesaid protrusion member 53a is not particularly limited, which is suitable as long as it can adjust the film thickness of a resist film appropriately. For example, there are examples of the protrusion members, such as that in a shape of a cross as shown in FIG. 4A, that provided with four discs as shown in FIG. 4B, that in a radical shape as shown in FIG. 4C, and that in a shape of a propeller as shown in FIG. 4D.

For example, when the protrusion member 53a is in the shape of the cross, four members which compose the cross preferably have the length L in about 5 mm and the height H in about 3 mm and, for example, resin is preferable as its material.

Further, although the underneath surface of the small lid 53 is level with the underneath surface of the lid body 45 in the structures shown in FIGS. 2 and 3, it may be so structured that the lower part of the protrusion member 53a is level with the underneath surface of the lid body 45 by making the position of the underneath surface of the small lid 53 to be higher than the underneath surface of the lid body 45. Thus, the occurrence of transfer to the substrate G, which is caused by providing the protrusion member 53a can be prevented.

Figure 12:
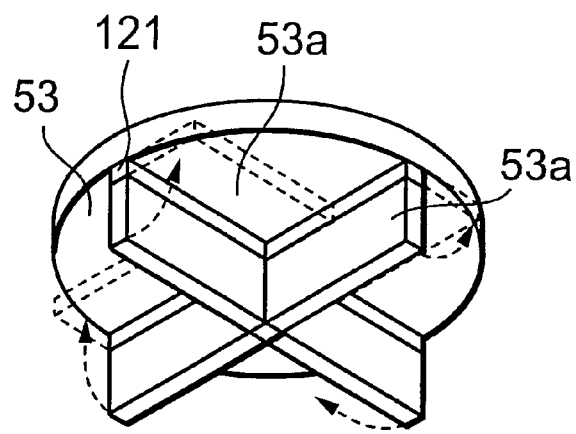
FIG. 12 is a view explaining still another structural example of the protrusion member.

Furthermore, as shown in FIG. 12, a drive mechanism 121 for raising and laying the protrusion member 53a may be provided to the base part of the protrusion member 53a so that the protrusion member 53a is raised up when the rotation speed of the substrate G is increasing, and the protrusion member 53a is laid down as shown in the broken line when the rotation speed of the substrate G is constant. Thus, a disturbance of the airflow can be avoided as far as possible.

Figure 13:
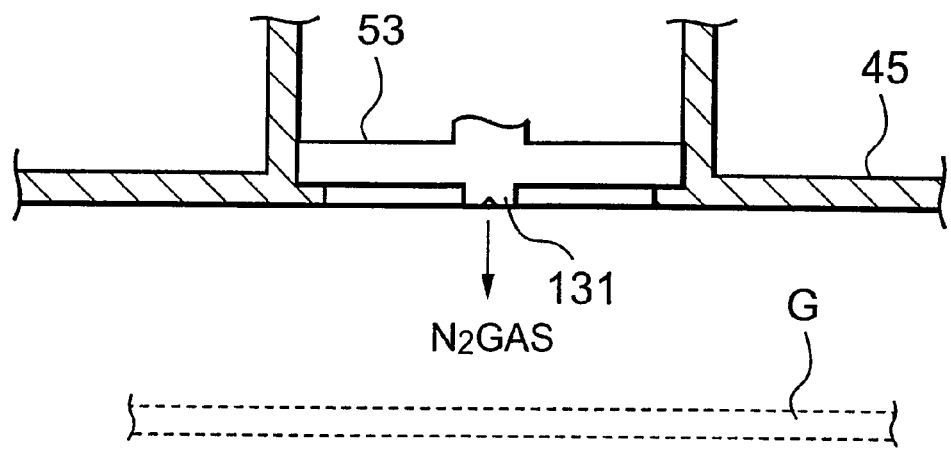
FIG. 13 is a view showing still another example of an airflow forming portion.

Moreover, besides the above-mentioned protrusion member 53a as the airflow forming portion, a nitrogen blow-out part 131 may be provided, for example, on the underneath surface of the small lid 53 as shown in FIG. 13 to form a desired airflow by discharging a nitrogen gas from the nitrogen blow-out part 131.

Figure 5:
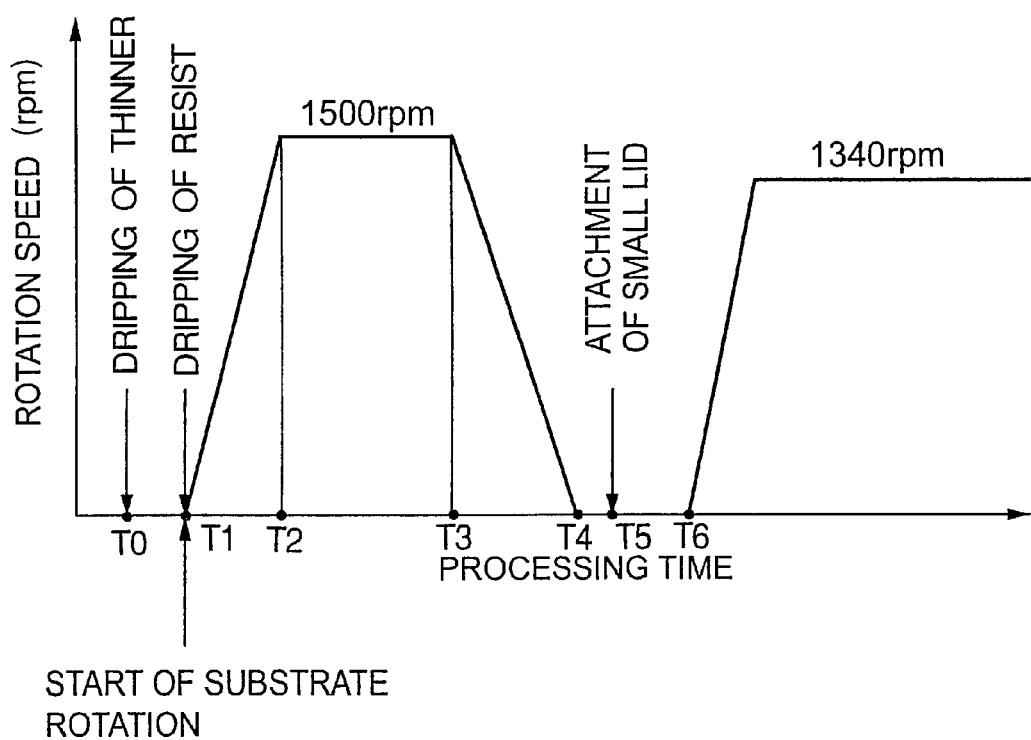
FIG. 5 is a graph showing a relationship between the processing time and the rotation speed of the substrate when an LCD substrate is subjected to a coating processing with a resist solution.

Next, the operation of forming the resist film on the surface of the substrate G by thus-structured resist coating unit (CT) will be explained. FIG. 5 is a graph showing a relationship between the processing time of the LCD substrate and the rotation speed.

First, as shown in FIG. 2, the annular lid body 45 is removed from the rotating cup 42 by the not-shown carrier arm, and the substrate G is carried onto the spin chuck 41 by the not-shown carrier arm to be vacuum-sucked.

The annular lid body 45 is attached into the upper opening of the rotating cup 42 by the not-shown carrier arm and then the resist solution discharge nozzle 51 and the solvent discharge nozzle 52 are positioned above the substrate G and above the opening 46 of the annular lid body 45.

As shown in FIG. 5, before the substrate G is rotated, the solvent such as thinner is discharged onto the substrate G from the solvent discharge nozzle 52 through the opening 46 of the annular lid body 45. Then, the rotation of the substrate G and the rotating cup 42 is started, and simultaneously, the resist solution is discharged onto the substrate G from the resist solution discharge nozzle 51 through the opening 46 of the lid body 45, and the resist is spread over while keeping the pre-wet effect of thinner which is diffused and spread, so that the resist film is formed on the substrate G. In discharging the solvent and the resist solution, the scatter of the solvent and the resist solution is prevented with the annular lid body 45.

Subsequently, the solvent discharge nozzle 52 and the resist solution discharge nozzle 51 are moved to the sheltering position as shown in FIG. 3, the rotation speed of the substrate G and the rotating cup 42 is increased to, for example, 1500 rpm, this rotation speed is maintained from time T2 to time T3, and then the rotation speed is decreased to stop the substrate G and the rotating cup 42 at time T4.

While the substrate G and the rotating cup 42 are stopped, as shown in FIG. 3, the small lid 53 is carried by the carrier arm 55 to be attached into the opening 46 of the annular lid body 45 at time T5. More specifically, the small lid 53 hung by the carrier arm 55 is inserted into the cylindrical member 47, the hooking claw 57 is released, and the small lid 53 is fittingly attached into the opening 46 and sealed by the sealing mechanism (not shown).

Next, as shown in FIG. 5, the rotation of the substrate G and the rotating cup 42 start at time T6, the rotation speed of the substrate G and the rotating cup 42 is increased to, for example, 1340 rpm and this rotation speed is maintained to adjust the film thickness of the resist film. Here, the small lid 53 which is attached into the opening 46 of the annular lid body 45 is rotated with the substrate G, the rotating cup 42 and the lid body 45.

When the resist film thickness is adjusted, the scatter of the resist solution to the outside can be securely prevented because the small lid 53 is attached into the opening 46 of the annular lid body 45. Further, the air can be prevented from flowing in through the opening 46 since the small lid 53 is attached thereinto, and hence the airflow which adversely affects the processing in the periphery of the substrate is not formed. Thus, it is possible to form the resist film with the uniform film thickness.

However, when the resist solution discharge nozzle 51 is inserted through the opening 46 in the center of the annular lid body 45 and the resist solution is discharged from the resist solution discharge nozzle 51 to form the resist film on the substrate G, the drying of the resist film in the area corresponding to the opening 46 progresses faster, as well as a peculiar region of the airflow is likely to be formed in the area which is right under the opening 46 of the rotating cup 42, that is in the center part. Therefore, an absence of the protrusion member 53a on the small lid 53 causes a problem that the film thickness of the resist film in the center part of the substrate G becomes thicker when the film thickness of the resist film is adjusted by rotating the substrate G with the small lid 53 attached.

Meanwhile, as in this embodiment, the protrusion member 53a is provided as the airflow forming portion on the underneath surface of the small lid 53 to position the protrusion member 53a inside the rotating cup 42 when the small lid 53 is attached into the opening 46 of the lid body 45 so that the airflow can be formed inside the rotating cup 42 when the rotating cup 42, the lid body 45 and the small lid 53 are rotated with the substrate G. and the film thickness of the resist film can be adjusted by the airflow. Thus, it is possible to obtain the resist film with the uniform film thickness.

Further, the rotating cup 42 is rotated to centrifuge the air inside the rotating cup 42 so that the air is flowed in from the outside through the inflow holes 59 of the lid body 45, as well as the airflow in which the air is flowed outside through the outflow holes 58 of the rotating cup 42 is formed as shown in the arrows in FIGS. 2 and 3. Namely, the inflow holes 59 and the outflow holes 58 also function as the auxiliary airflow forming portions. By controlling the airflow, the drying speed of the resist solution in the periphery of the substrate G can be adjusted and the film thickness of the resist film in the periphery of the substrate G can be controlled so that the uniformity of the resist film thickness can be increased further.

Furthermore, a nozzle drive mechanism and the small lid drive mechanism are disposed on the outer lid 60 so that the movement of the nozzles 51, 52 and the small lid 53 become smaller, which makes it possible to increase throughput and to achieve miniaturization of the nozzle drive mechanism and the small lid drive mechanism. Moreover, the drive mechanisms are mounted on the outer lid 60 so that the carriage of the substrate can be smoothly performed when the substrate is carried in/out of the rotating cup 42, because there is nothing which can cause interference with the carrier arm of the substrate when the outer lid 60 and the lid body 45 are raised to the height where they do not interfere with the substrate carrier arm.

Next, the practical evaluation result of the film thickness distribution of the resist film regarding the cases in which the protrusion member 53a is provided/not provided on the small lid 53 will be explained.

Figure 6:
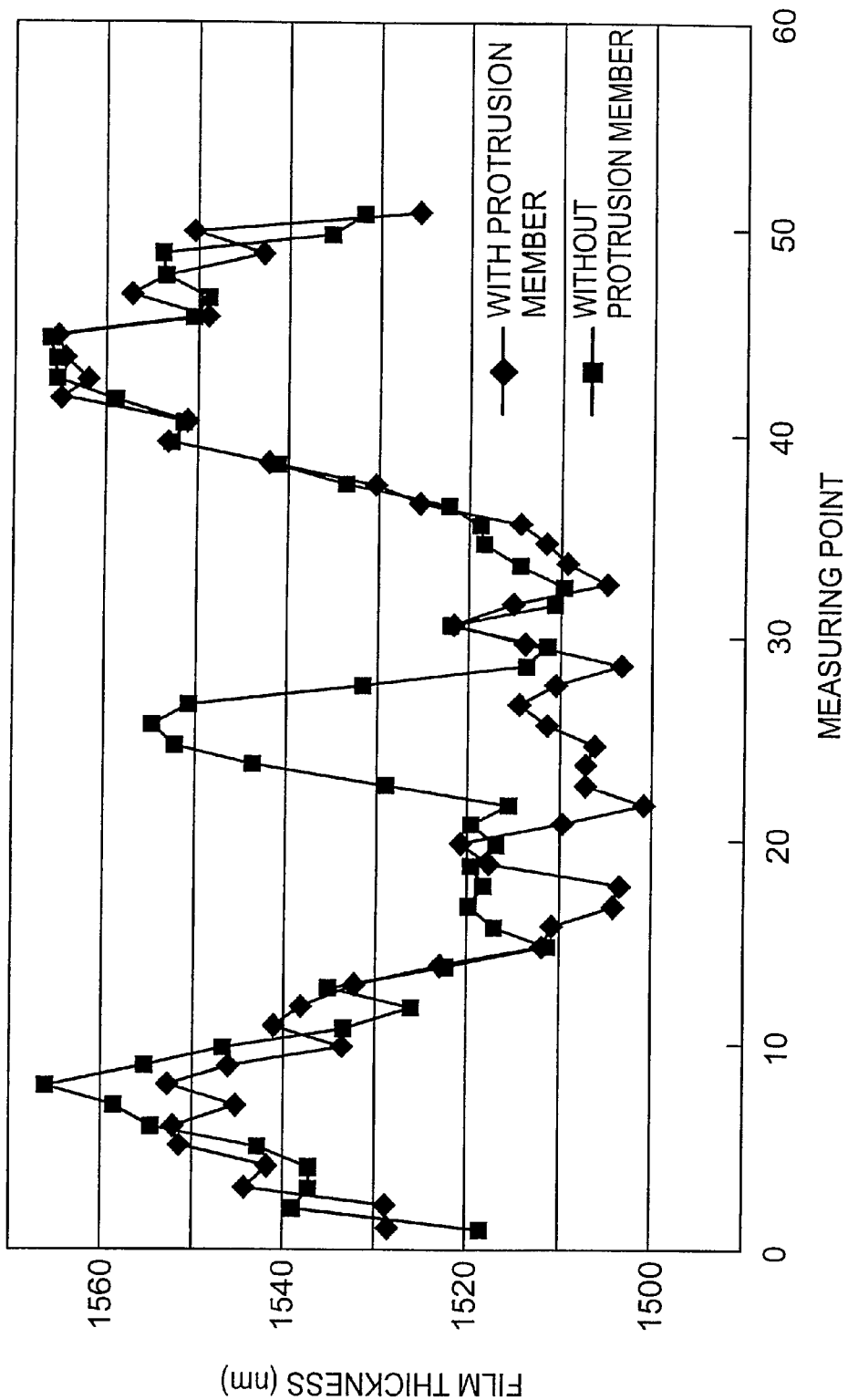
FIG. 6 is a graph showing a film thickness distribution of a resist film on the substrate by comparison between the cases in which the protrusion member is provided/not provided on the small lid.

Here, a lid having an opening of 154 mm in diameter is used, and as the small lid attached into the opening, one with a protrusion member shown in FIG. 4C attached to the underneath surface thereof, and one without a protrusion member attached thereto are used. Incidentally, the height of the protrusion member is 6 mm and the width thereof is 1 mm. By using them, a dynamic coating is performed according to the aforesaid procedures, and the resist film thickness is measured at each point. The measurement of the film thickness is performed at the equally spaced 51 points on a diagonal line of a rectangular substrate of 550 mm×670 mm leaving its periphery by 10 mm. Its result is shown in FIG. 6. As shown in FIG. 6, it is confirmed that the film thickness in the center part of the substrate demonstrates a propensity to become thicker when the small lid without the protrusion member attached thereto is used, while the film thickness in the center part of the substrate does not become thick when the small lid with the protrusion member is used. Note that the film thickness becomes thick in the shoulder parts being outward from the center, which can be rectified by the cooling in the cooling unit thereafter. However, when the center part becomes thick as in the case without using the protrusion member, it is generally difficult to rectify the film thickness. Meanwhile, it is confirmed that the film thickness can be adjusted by using the protrusion member to obtain the uniformity even if the film thickness in the center part becomes thick like this.

Figure 7:
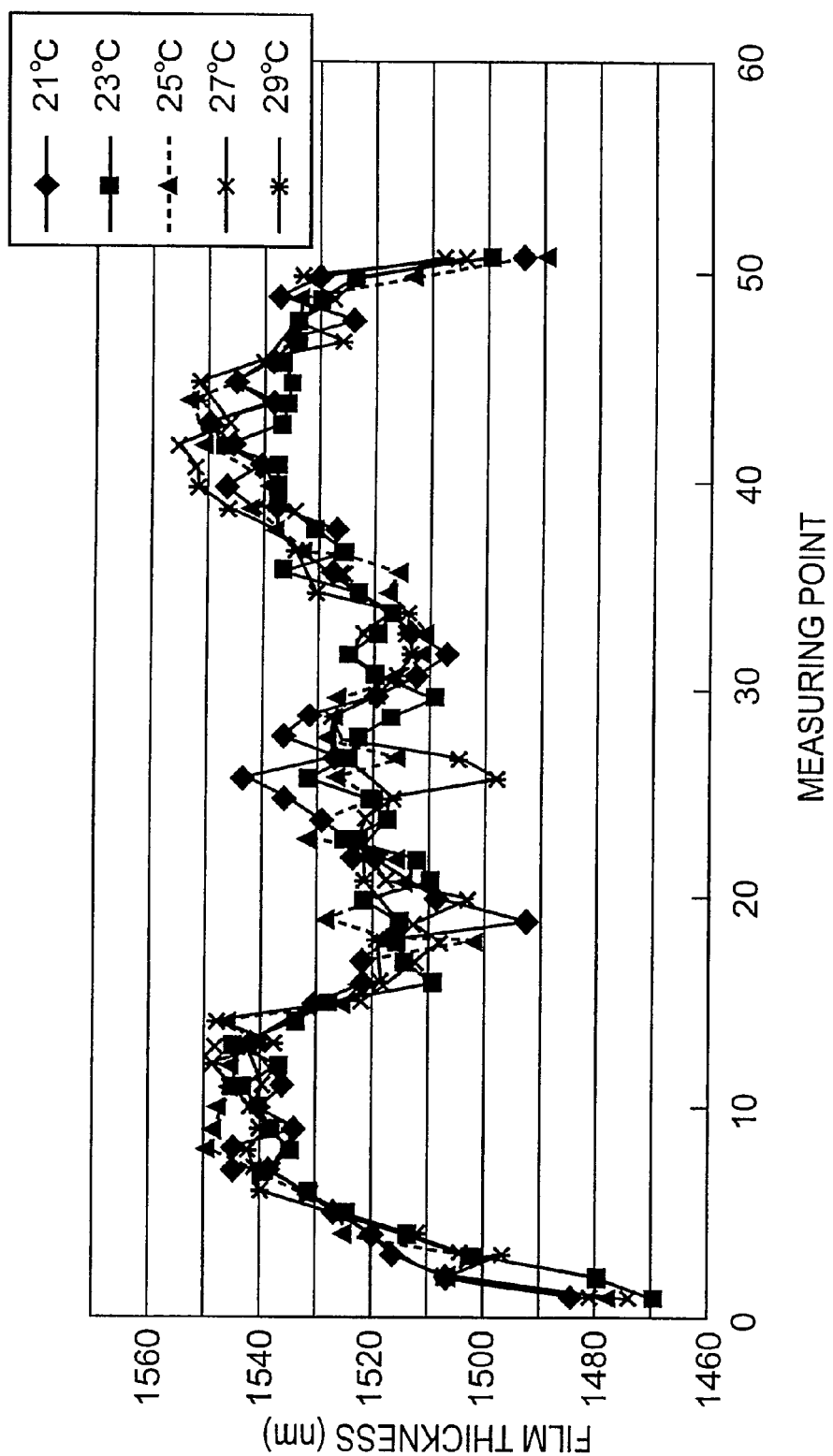
FIG. 7 is a graph showing the film thickness distribution of the resist film on the substrate when the protrusion member is provided on the small lid and when the temperature of the resist solution is changed.

Further, the film thickness distribution of the resist film when a protrusion member as shown in FIG. 4A is attached to the underneath surface of the small lid and the film is formed according to the aforesaid procedures while changing the temperature of the resist solution is found out. Its result is shown in FIG. 7. As shown in FIG. 7, it is confirmed that a profile of the film thickness and an average film thickness hardly change although the temperature of the resist solution changes. From this result, it is confirmed that when the dynamic coating is performed according to the aforesaid procedures, the uniformity of the film thickness can be obtained by providing the protrusion member onto the small lid, regardless of the resist temperature. This suggests that it is possible to make the resist film thickness uniform without controlling the temperature of the resist solution at the tip of the nozzle.

Figure 8:
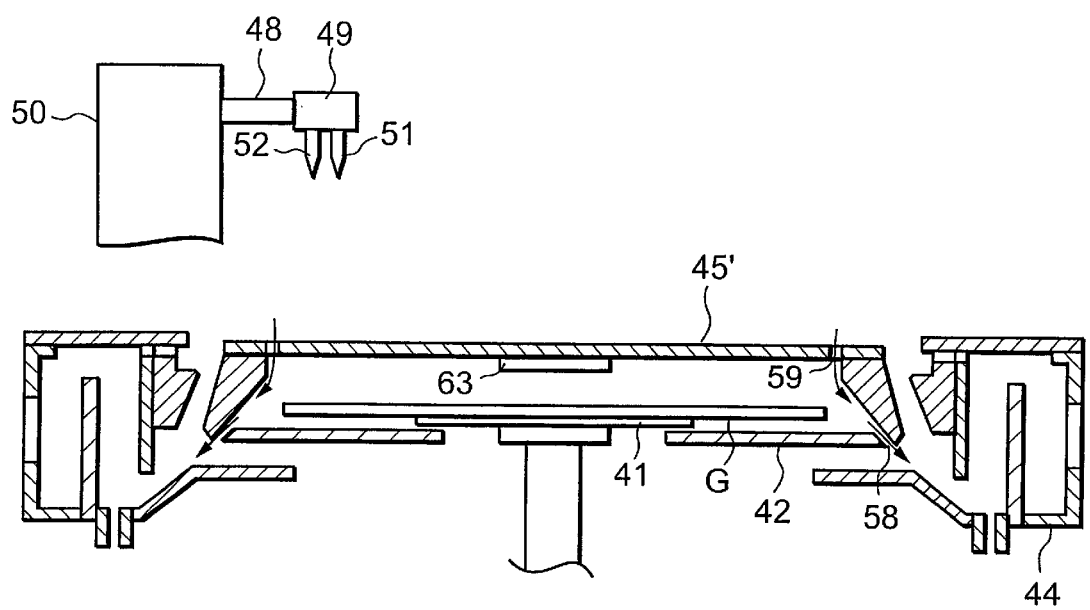
FIG. 8 is a sectional view showing a resist coating unit according to another embodiment of the present invention.

Next, a resist coating unit according to another embodiment of the present invention will be practically explained. In this embodiment, as shown in FIG. 8, a lid body 45' without the formation of an opening is provided to be freely detached and attached, and a protrusion member 63 is provided on the underneath surface of the lid body 45'. Since other members are the same as those in the aforesaid embodiment, the same numerals and symbols as in FIG. 2 will be used in the figures and the description will be omitted.

In this unit, when a resist solution is discharged onto a substrate G, the lid body is moved upward to the sheltering position by a not-shown carrier arm, the resist solution is dropped while the substrate G is at a standstill, then the substrate G is rotated to spread the resist solution over its entire face, subsequently the lid body 45' is mounted on a rotating cup 42 to obtain an almost airtight condition inside the rotating cup 42, and the substrate G is rotated with the rotating cup 42 and the lid body 45'. Also in this embodiment, the protrusion member 63 is rotated with the lid body 45', thereby allowing an airflow to occur in the rotating cup 42. Further, it is possible to adjust the film thickness of a resist film on the substrate G by the airflow. When the film thickness in the center of the substrate needs to be adjusted, the protrusion member 63 should be attached to the almost center of the lid body 45', but when the part in which the film thickness needs to be adjusted is not in the center, the attaching position of the protrusion member 63 can be changed corresponding to its position.

Further, in the aforesaid resist coating unit, when the film thickness is adjusted, the inside of the cup is made to be in the almost airtight condition and then the cup is rotated with the substrate, but the present invention can be applied to the case in which the resist solution is coated in the cup of an open- and a fixed-type. Namely, when a semiconductor wafer is used as the substrate, the resist solution is normally coated in the fixed cup in the open state without blockade, while taking in a downflow of the air with its temperature and humidity controlled from the top of the cup. The case in which the present invention is applied to the coating processing unit like this will be explained in FIG. 9.

Figure 9:
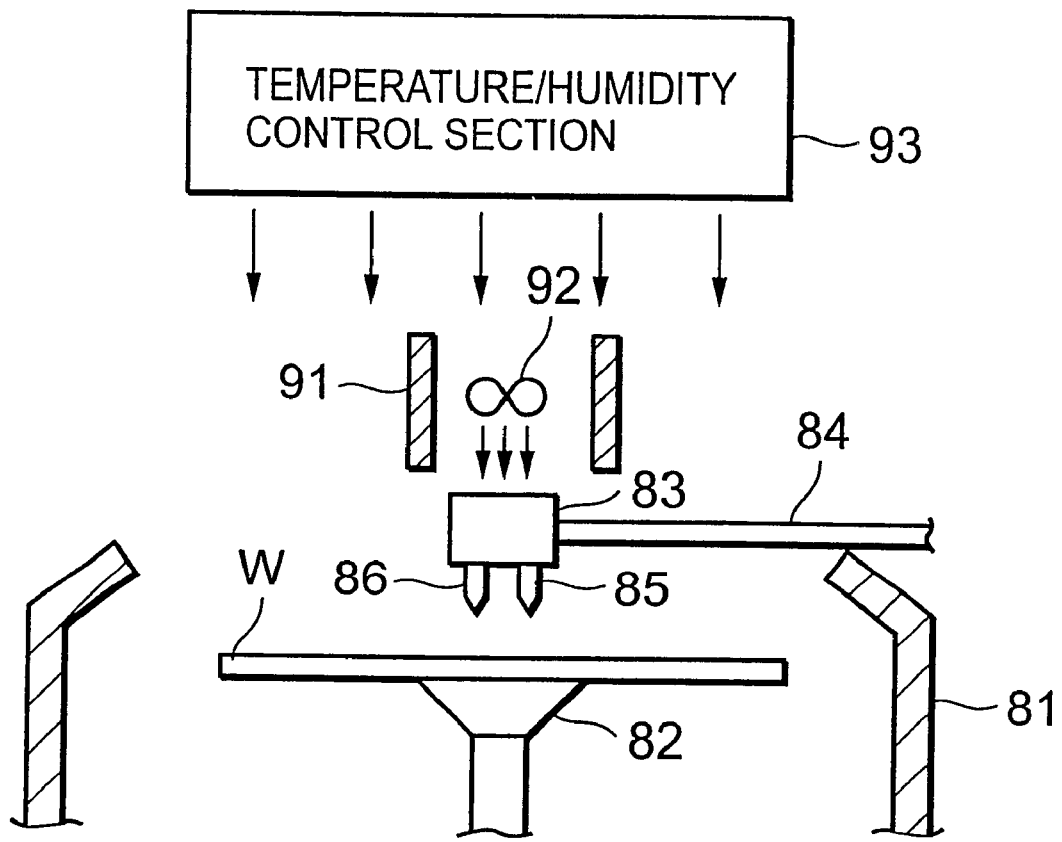
FIG. 9 is a sectional view showing a resist coating unit according to still another embodiment of the present invention.
Figure 10:
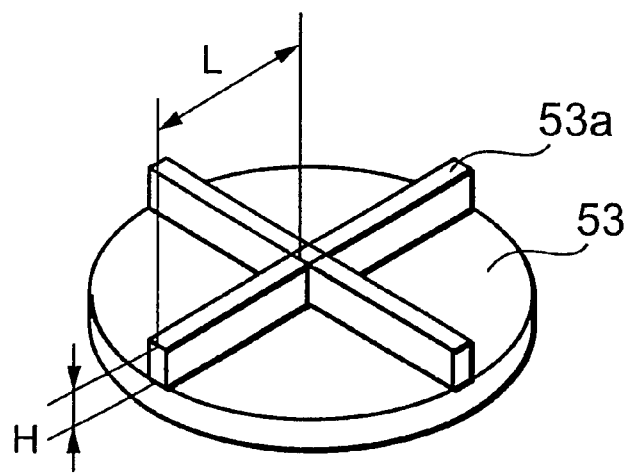
FIG. 10 is a perspective view explaining a specific example of the protrusion member in a shape of a cross.
Figure 11:
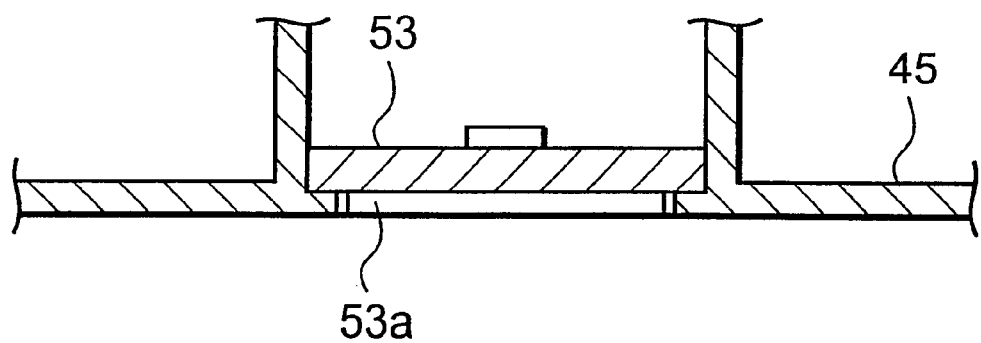
FIG. 11 is a view explaining another structural example of the protrusion member.

As shown in FIG. 9, a spin chuck 82 which can be rotated by a not-shown motor is provided inside a cup 81 which is fixingly provided, and a semiconductor wafer W as the substrate is suction-held on the spin chuck 82. An arm 84 is attached with a jet head 83 to the tip thereof, which makes the jet head 83 movable between the position directly above the center of the semiconductor wafer W and the sheltering position departing from the cup 81. A resist solution discharge nozzle 85 and a solvent discharge nozzle 86 for discharging the solvent such as thinner are provided on the jet head 83, and the resist solution and the solvent are respectively supplied from a not-shown supplying source to the resist solution discharge nozzle 85 and the solvent discharge nozzle 86. A cylindrical body 91 is provided in the position directly above the center part of the semiconductor wafer W, and a fan 92 as a ventilating means which functions as an airflow forming portion is provided therein. Further, above the cylindrical body 91 and the fan 92, a temperature/humidity control section 93 is provided, which supplies a downflow of the air with its temperature, humidity and the concentration of the solvent such as thinner controlled into the cup 81.

In the resist coating unit like this, the jet head 83 is moved to the position above the center of the semiconductor wafer W, the solvent such as thinner, for example, is first discharged onto the semiconductor wafer W from the solvent discharge nozzle 86 to perform the pre-wet processing, then the resist solution is discharged from the resist solution discharge nozzle 85, the semiconductor wafer W is rotated at a predetermined speed, and the resist solution is spread over the entire face of the semiconductor wafer W. Subsequently, the jet head 83 is moved to the sheltering position, and the airflow is formed by rotating the fan 92, while the rotation speed of the semiconductor wafer W is increased to adjust the film thickness. During this processing, the air with its temperature and humidity controlled is supplied to the cup 81 from the temperature/humidity control section 93. In this case, an airflow which is different from the usual downflow is formed by the rotation of the fan 92, which makes it possible to adjust the resist film thickness by making this airflow affect the suitable position of the semiconductor wafer W. In the figure, the downflow is formed by the fan 92 in the center part of the semiconductor wafer W, thereby allowing the adjustment of the film thickness when the film thickness in the center part of the semiconductor wafer W becomes thicker. Further, the cylindrical body 91 is provided so that the airflow by the fan 92 can exert its effect locally, which makes it possible to adjust the film thickness locally. The airflow by the fan 92 is not limited to the downflow like this, and an upstream airflow can be formed by rotating it reversely, which raises the possibility that, when the film thickness is thin in the center part, the uniform film thickness can be obtained by forming the upstream airflow like this. Furthermore, the position for installing the fan can be set variously according to the position in which the film thickness needs to be adjusted in addition to the center part. Therefore, it is possible to contribute to the adjustment of the various profiles of the film thickness. Further, the adjustment of the profile of the film thickness can be achieved by adjusting the airflow like this, which raises the possibility that the film thickness can be controlled without controlling the temperature and the humidity inside the cup 81.

It is to be understood that the present invention is not limited to the above-described embodiments and various changes may be made. For example, the above-described embodiments explained the case in which the present invention is applied to the resist coating and developing system, which is not restrictive. Further, the explanation was made for coating the resist solution, but it is possible to apply other coating solutions as long as the coating film is formed by means of a spin coating method. Furthermore, in the above-described embodiments, the LCD substrate and the semiconductor wafer were used as the substrates to be processed, which is not restrictive and it can be applied to the other substrates for forming the coating film.

As described above, according to the present invention, the airflow forming portion for forming the airflow which can adjust the film thickness of the substrate is provided in the processing container so that the variation of the coating film thickness by the change of the temperature of the coating solution can be decreased and the film thickness of the coating film can be adjusted.

Further, in the coating processing apparatus which includes the lid body having the opening and the small lid for blocking up the opening and is able to perform the so-called dynamic coating method, the protrusion member is provided on the underneath surface of the small lid and the protrusion member is made to position itself inside the processing container when the small lid is attached into the opening of the lid body, which makes it possible to adjust the film thickness of the coating film such as the resist film by forming the airflow inside the processing container when the processing container, the lid body and the small lid are rotated with the substrate, and to obtain the coating film with the uniform film thickness.

The aforementioned embodiments have the intention of clarifying technical meaning of the present invention. Therefore, the present invention is not intended to be limited to the above concrete embodiments and to be interpreted in a narrow sense, and various changes may be made therein without departing from the spirit of the present invention and within the meaning of the claims.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A coating processing apparatus for coating a coating solution onto the surface of a substrate, comprising:
    a rotating cup having an opening portion on the top thereof and housing the substrate;
    a drain cup surround the rotating cup;
    rotating means for rotating the rotating cup;
    a spin chuck for holding and rotating the substrate in the rotating cup;
    a lid body having an opening and attached to said rotating cup for closing the opening portion, said lid body defining a processing space between the lid body and the substrate on the spin chuck;
    a coating solution discharge nozzle for discharging the coating solution onto the substrate held on the spin chuck through the opening of said lid body;
    a small lid attached to said lid body for blocking up the opening of said lid body; and
    a protrusion member placed on a lower part of said small lid such that the protrusion member faces the substrate on the spin chuck for generating an airflow in the processing space which flows along the substrate from a center to a periphery of the processing space while the substrate is rotated by the spin chuck and the rotating cup is rotated by the rotating means.

2. The apparatus as set forth in claim 1, wherein said rotating cup includes an air inflow hole and an air outflow hole.

3. The apparatus as set forth in claim 1,
    wherein the opening of said lid body is formed in the center part thereof.

4. The apparatus as set forth in claim 1, wherein said spin chuck starts rotating the substrate substantially simultaneously with the discharge of the coating solution from said coating solution discharge nozzle.

5. The apparatus as set forth in claim 1, wherein an end part of said protrusion member is flush with the underneath surface of said lid body.

6. A coating processing apparatus for coating a coating solution onto a surface of a substrate, comprising:
    a rotating cup having an opening portion on the top thereof and housing the substrate;
    a drain cup surrounding the rotating cup;
    rotating means for rotating the rotating cup;
    a spin chuck for holding and rotating the substrate in the rotating cup;
    a lid body attached to the rotating cup, for closing the opening portion, said lid body defining a processing space between the lid body and the substrate on the spin chuck;
    a coating solution discharge nozzle for discharging the coating solution onto the substrate held on the spin chuck; and
    a protrusion member placed on a lower part of said lid body such that the protrusion member faces the substrate on the spin chuck, for generating an airflow in the processing space which flows along the substrate from a center to a periphery of the processing space while the substrate is rotated by the spin chuck and the rotating cup is rotated by the rotating means.

7. The apparatus as set fourth in claim 6,
    wherein the protrusion member is removably placed on an undersurface of the lid body.

8. The apparatus as set forth in claim 6,
    wherein the protrusion member comprises four linear bars which are placed on the lid body around, but not overlapping in a plane, a center of rotation of the lid body and which form a cross in the plane.

9. The apparatus as set forth in claim 6,
    wherein the protrusion member comprises four disks placed on the lid body around, but not overlapping in a plane, a center of rotation of the lid body.

10. The apparatus as set forth in claim 6,
    wherein the protrusion member comprises a plurality of linear bars placed on the lid body around, but not overlapping in a plane, a center of rotation of the lid body.

11. The apparatus as set forth in claim 6,
    wherein the protrusion member comprises a plurality of curved bars which are placed on the lid body around, but not overlapping in a plane, a center of rotation of the lid body and which form a propeller shape.

12. The apparatus as set forth in claim 6, further comprising:
    an arm for supporting the protrusion member; and
    means for raising and lowering the arm.

13. The apparatus as set forth in claim 6, further comprising:
    an air blow-out part provided on an undersurface of the lid body.

14. The apparatus as set forth in claim 6, further comprising:
    ventilating means provided in the rotating cup directly above the substrate, for supplying air toward the substrate.

* * * * *